United States Patent
Gao et al.

(10) Patent No.: US 11,088,227 B2
(45) Date of Patent: Aug. 10, 2021

(54) DISPLAY PANEL AND MANUFACTURING METHOD THEREOF

(71) Applicant: BOE TECHNOLOGY GROUP CO., LTD., Beijing (CN)

(72) Inventors: Xinwei Gao, Beijing (CN); Peng Li, Beijing (CN); Dandan Zang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/558,589

(22) Filed: Sep. 3, 2019

(65) Prior Publication Data

US 2020/0075696 A1 Mar. 5, 2020

(30) Foreign Application Priority Data

Sep. 4, 2018 (CN) .......................... 201811026987.9

(51) Int. Cl.
*H01L 27/32* (2006.01)
*H01L 51/56* (2006.01)

(52) U.S. Cl.
CPC .......... *H01L 27/3246* (2013.01); *H01L 51/56* (2013.01); *H01L 2227/323* (2013.01)

(58) Field of Classification Search
CPC ................. H01L 27/3246; H01L 51/56; H01L 2227/323; H01L 51/5234; H01L 2251/5315; H01L 51/5225; H01L 51/5228; H01L 27/3276; H01L 51/0032–0095; H01L 27/3202–3204; H01L 27/3209; H01L 27/3225–3234; H01L 27/3241–3297; H01L 27/32–3234;
(Continued)

(56) References Cited

U.S. PATENT DOCUMENTS

2005/0247936 A1* 11/2005 Bae ...................... H01L 27/3253
257/59

FOREIGN PATENT DOCUMENTS

CN       103972270 A       8/2014
CN       104282712 A       1/2015
(Continued)

OTHER PUBLICATIONS

First Office Action dated Apr. 24, 2020 corresponding to Chinese application No. 201811026987.9.

*Primary Examiner* — Cuong B Nguyen
(74) *Attorney, Agent, or Firm* — Nath, Goldberg & Meyer; Joshua B. Goldberg

(57) ABSTRACT

A display panel and a manufacturing method thereof are provided. The display panel includes a first substrate and a second substrate opposite to each other; the first substrate includes a first base, a pixel definition layer on the first base, and at least one OLED; each OLED includes a first electrode, a light emitting layer, and a second electrode sequentially provided on the first base; and the pixel definition layer defines pixel regions spaced apart, the at least one OLED is provided in the pixel regions, and the pixel definition layer between at least two adjacent pixel regions includes one opening; the second substrate includes a second base, and a connection electrode on a side of the second base proximal to the pixel definition layer, which is arranged inside the opening, and is electrically coupled to the second electrode of the OLEDs adjacent to the opening.

18 Claims, 10 Drawing Sheets

(58) Field of Classification Search
CPC ............. H01L 31/125; H01L 51/50–56; H01L 2227/32–326
See application file for complete search history.

(56) References Cited

FOREIGN PATENT DOCUMENTS

| | | |
|---|---|---|
| CN | 106876331 A | 6/2017 |
| CN | 107331691 A | 11/2017 |

* cited by examiner

DISPLAY PANEL AND MANUFACTURING METHOD THEREOF

CROSS-REFERENCE TO RELATED APPLICATIONS

The present application claims the priority of Chinese Patent Application No. 201811026987.9, filed on Sep. 4, 2018, the contents of which are incorporated herein in their entirety by reference.

TECHNICAL FIELD

The present disclosure relates to the field of display technology, and in particular, relates to a display panel and a method for manufacturing a display panel.

BACKGROUND ART

An organic light emitting display is a flat panel display in which an organic material is driven under an electric field to emit light by carrier injection and recombination. Compared to a currently predominant liquid crystal display (LCD) or a plasma display panel (PDP), an organic light emitting diode (OLED) device used in the organic light emitting display has characteristics such as low cost, all solid state, active light emission, high brightness, high contrast ratio, wide view angle, quick response speed, thin thickness, low voltage DC driving, low power consumption, wide range of operation temperature, soft screen display and so forth, and is an ideal light emitting device to be used in the flat panel display.

SUMMARY

The present disclosure provides a display panel and a manufacturing method of the display panel.

The display panel includes a first substrate and a second substrate provided opposite to each other; the first substrate includes a first base, and a pixel definition layer on the first base, and at least one organic light emitting diode, each of the at least one organic light emitting diode includes a first electrode, a light emitting layer, and a second electrode sequentially provided along a direction directed away from the first base, and the pixel definition layer defines a plurality of pixel regions spaced apart from each other, the at least one organic light emitting diode is provided in the pixel regions, respectively, and an opening is disposed between at least two adjacent pixel regions in the pixel definition layer, and the second substrate includes a second base and a connection electrode on a side of the second base proximal to the pixel definition layer, and the connection electrode is inside the opening, and is electrically coupled to the second electrode of one or more organic light emitting diodes adjacent to the opening.

In an embodiment, the connection electrode fills the opening and is in contact with the second base.

In an embodiment, the first substrate further includes at least one auxiliary electrode in the opening, and the at least one auxiliary electrode is electrically coupled to the connection electrode.

In an embodiment, an orthographic projection of the pixel definition layer on the first base covers an orthographic projection of the at least one auxiliary electrode on the first base.

In an embodiment, the at least one auxiliary electrode includes an annular auxiliary electrode, and the annular auxiliary electrode is arranged in the opening and in contact with the pixel definition layer.

In an embodiment, the pixel definition layer includes a first pixel definition sub-layer and a second pixel definition sub-layer provided sequentially along a direction directed away from the first base; and an orthographic projection of the second pixel definition sub-layer on the first base completely covers the orthographic projection of the at least one auxiliary electrode on the first base, and the orthographic projection of the second pixel definition sub-layer on the first base completely partially covers an orthographic projection of the first pixel definition sub-layer on the first base.

In an embodiment, a light emitting material of the light emitting layer and an electrode material of the second electrode are provided sequentially on the first base in the opening along the direction directed away from the first base, and each of a height of the light emitting material of the light emitting layer and a height of the electrode material of the second electrode is smaller than a height of the at least one auxiliary electrode.

In an embodiment, the at least one auxiliary electrode is spaced apart from the pixel definition layer, and a dam is provided on the at least one auxiliary electrode, and a cross section of the dam along a direction perpendicular to the first base is an inverted trapezoid.

In an embodiment, the at least one auxiliary electrode in the opening includes an annular auxiliary electrode in the opening and spaced apart from the pixel definition layer, and the dam provided on the annular auxiliary electrode is an annular dam; the connection electrode includes a first connection sub-electrode inside the annular auxiliary electrode and the annular dam, and a second connection sub-electrode located outside the annular auxiliary electrode and the annular dam; and second electrodes of organic light emitting diodes adjacent to the opening are electrically coupled to each other via the at least one auxiliary electrode, the first connection sub-electrode, and the second connection sub-electrode.

In an embodiment, a light emitting material of the light emitting layer and an electrode material of the second electrode are provided sequentially inside the annular auxiliary electrode in the opening along a direction directed away from the first base.

In an embodiment, the opening provided in the pixel definition layer between two adjacent pixel regions has a rectangular shape extending along a traveling direction of the pixel definition layer at which the opening is located, a length of the opening is about equal to a length of each of the two adjacent pixel regions, and a width of the opening is in a range of about 100-200 μm.

The manufacturing method of a display panel includes forming a first substrate, wherein the first base includes a pattern including a pixel definition layer on a first base, the pixel definition layer defines a plurality of pixel regions spaced apart from each other, at least one organic light emitting diode is respectively formed in the pixel regions, each of the at least one organic light emitting diode includes a first electrode, a light emitting layer, and a second electrode sequentially formed along a direction directed away from the first base, and an opening is disposed between at least two adjacent pixel regions in the pixel definition layer; forming a second substrate, wherein the second substrate includes a connection electrode material at a predetermined position on a second base; and aligning and assembling the first substrate and the second substrate, wherein the connection electrode material is arranged in the opening to be electrically coupled to a second electrode of one or more organic light emitting diodes adjacent to the opening.

In an embodiment, the forming a second substrate includes forming the connection electrode material on the second base at a position corresponding to the opening by a screen printing process; and after aligning and assembling the first substrate and the second substrate, the manufacturing method of the display panel further includes baking the connection electrode material in the opening dry by a baking process to form the connection electrode.

In an embodiment, the forming the first substrate includes forming at least one auxiliary electrode on the first base at a position corresponding to the opening, after aligning and assembling the first substrate and the second substrate, second electrodes of organic light emitting diodes adjacent to the opening are electrically coupled to each other via the at least one auxiliary electrode and the connection electrode.

In an embodiment, an orthographic projection of the pixel definition layer on the first base covers an orthographic projection of the at least one auxiliary electrode on the first base.

In an embodiment, the forming the first substrate includes forming, on the first base, a pattern including a first electrode of each of the at least one organic light emitting diode by a patterning process; forming, on the first base subjected to the above step, by a patterning process, a pattern including a pixel definition layer, wherein the pixel definition layer defines a plurality of pixel regions spaced apart each other for accommodating the at least one organic light emitting diode, and the pixel definition layer between at least two adjacent pixel regions includes one opening; and forming, on the first base subjected to the above step, a light emitting layer and a second electrode of each of the at least one organic light emitting diode, wherein the second electrode of the organic light emitting diode is disconnected at the opening.

In an embodiment, the forming the first substrate includes forming, on the first base, a pattern including a first electrode of each of the at least one organic light emitting diode by a patterning process; forming, on the first base subjected to the above step, by a patterning process, a pattern including at least one auxiliary electrode in a region defined by at least two adjacent first electrodes; forming, on the first base subjected to the above step, by a patterning process, a pattern including a first pixel definition sub-layer, wherein the first pixel definition sub-layer is formed between the first electrode and the auxiliary electrode adjacent thereto, and surrounds the first electrode, and contacts the auxiliary electrode; forming, on the first base subjected to the above step, by a patterning process, a pattern including a second pixel definition sub-layer, wherein a surface of the second pixel definition sub-layer proximal to the first base completely covers a surface of the first pixel definition sub-layer distal to the first base and partially covers a surface of the auxiliary electrode distal to the first base, and an orthographic projection of the second pixel definition sub-layer on the first base completely covers an orthographic projection of the at least one auxiliary electrode on the first base; and forming, on the first base subjected to the above step, a light emitting layer and a second electrode of each of the at least one organic light emitting diode, wherein the light emitting layer and the second electrode each are disconnected at the opening.

In an embodiment, the forming the first substrate includes forming, on the first base, a pattern including a first electrode of each of the at least one organic light emitting diode by a patterning process; forming, on the first base subjected to the above step, by a patterning process, a pattern including at least one auxiliary electrode in a region defined by at least two adjacent first electrodes; forming, on the first base subjected to the above step, by a patterning process, a pattern including a pixel definition layer, wherein the pixel definition layer is formed between the first electrode and the auxiliary electrode adjacent thereto, and the pixel definition layer is not in contact with the auxiliary electrode; forming, on the at least one auxiliary electrode, by a patterning process, a pattern including a dam, wherein a surface of the dam proximal to the first base completely covers a surface of the auxiliary electrode distal to the first base, and a cross section of the dam along a direction perpendicular to the first base is an inverted trapezoid; and forming, on the first base subjected to the above step, a light emitting layer and a second electrode of each of the at least one organic light emitting diode, wherein the light emitting layer and the second electrode of the organic light emitting diode each are disconnected at a position of an edge of a surface of the dam distal to the first base.

DETAILED DESCRIPTION

In order to help those skilled in the art better understand technical solutions of the present disclosure, the present disclosure is described in further detail below in conjunction with the accompanying drawings and embodiments.

A top-emitting OLED can significantly improve an aperture ratio of the OLED, while improving pixel density (PPI), and is a hot spot in development of high resolution display technology. The top-emitting OLED in the related art commonly uses a transparent cathode such as Mg:Ag, IZO or the like, and there is a problem of high series resistance (Rs)

value of the cathode. Thus, for a large-sized display screen, uniformity of characteristics such as screen display brightness cannot be guaranteed.

Display panels provided by the embodiments described below all include a first substrate and a second substrate provided opposite to each other, the first substrate includes a first base, a pixel definition layer on the first base, and at least one OLED; each of the at least one OLED includes a first electrode, a light emitting layer, and a second electrode sequentially disposed along a direction directed away from the first base; the pixel definition layer defines a plurality of pixel regions which are spaced apart from each other, the at least one OLED is disposed in the pixel regions, respectively, and a part of the pixel definition layer between at least two adjacent pixel regions includes an opening; the second substrate includes a second base, and a connection electrode which is located on a side of the second base proximal to the pixel definition layer at a position corresponding to the opening; the connection electrode is disposed inside the opening; the second electrode of the OLEDs adjacent to the opening are electrically connected to each other via the connection electrode.

In the present disclosure, the OLED may be a top-emitting OLED or a bottom-emitting OLED. Since a second electrode of the top-emitting OLED is required to be of a transparent structure, a material such as Mg:Ag, IZO, ITO, AZO or the like is usually selected, and the second electrode is relatively thin, resulting in a large resistance of the second electrode and thus causing a serious problem of IR Drop. Therefore, the top-emitting OLED is mainly described below as an example in the embodiments. It is further to be noted that, one of the first electrode and the second electrode of the OLED is an anode, and the other is a cathode; in the embodiments described below, description is given of an example in which the first electrode is an anode, and the second electrode is a cathode.

Figure 1:
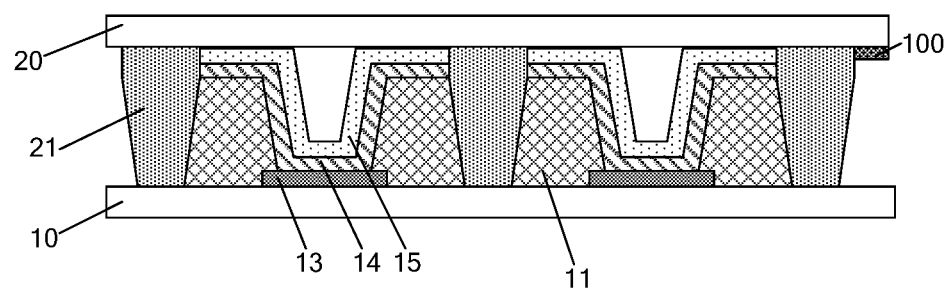
FIG. 1 is a schematic diagram of a structure of a display panel according to an embodiment of the present disclosure.

As shown in FIG. 1, the present embodiment provides a display panel, including: a first substrate and a second substrate provided opposite to each other.

Figure 3:
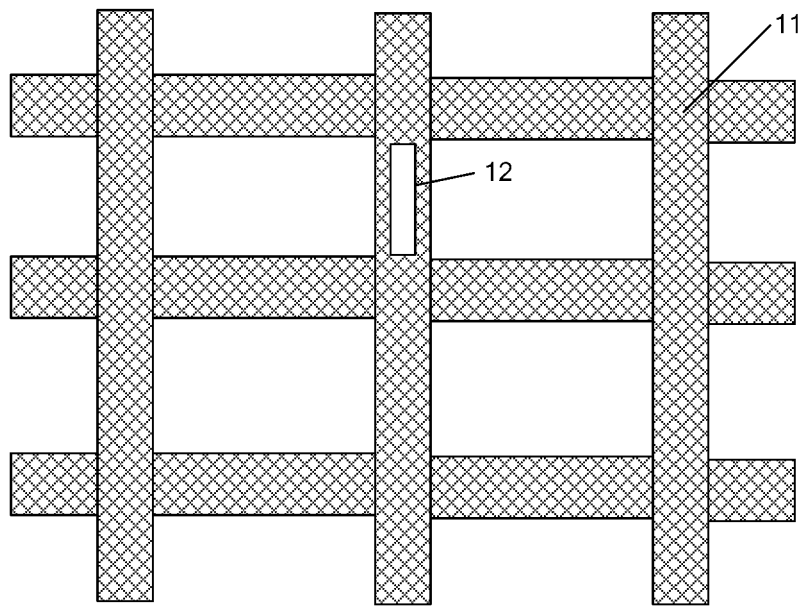
FIG. 3 is a schematic plan view of a display panel according to an embodiment of the present disclosure.

The first substrate includes a first base 10, and a pixel definition layer 11 located on the base 10, the pixel definition layer 11 defines a plurality of pixel regions which are spaced apart from each other and used to accommodate at least one OLED; each of the at least one OLED includes an anode 13, a light emitting layer 14, and a cathode 15 sequentially disposed along a direction directed away from the first base 10; and the pixel definition layer 11 between at least two adjacent OLEDs includes one opening 12, as shown in FIG. 3.

It is to be noted herein that, the so-called "OLED disposed in the pixel region defined by the pixel definition layer 11" in the present embodiment, means that the OLED corresponds to the region defined by the pixel definition layer 11, and does not mean in a strict sense that a pattern size of the OLED is equal to that of the region defined by the pixel definition layer 11.

The second substrate includes a second base 20, and a connection electrode 21, which is located on a side of the second base 20 proximal to the pixel definition layer at a position corresponding to the opening 12; the connection electrode 21 is provided inside the opening 12; cathodes 15 of adjacent OLEDs at positions corresponding to the opening 12 are electrically coupled to each other via the connection electrode 21.

Since the second substrate of the display panel of the present embodiment includes the connection electrode 21 which is disposed at a position corresponding to the opening 12 on the first substrate, the connection electrode 21 may fill the opening 12, and cathodes 15 of OLEDs adjacent to the opening 12 are electrically coupled to each other via the connection electrode 21. In general, a depth of the opening 12 formed by a semiconductor process is far greater than a thickness of the cathode 15 of the OLED, thus, the resistance of the connection electrode 21 of a unit length is far less than the resistance of the cathode 15 of a unit length; as such, with cathodes 15 of adjacent OLEDs electrically coupled to each other via the connection electrode 21, compared to a planar electrode in the display panel in the related art (cathodes 15 of OLEDs are of an integrated structure), the total resistance of the cathodes 15 of the OLEDs in the present embodiment which are electrically coupled to each other is significantly reduced, which can effectively eliminate the problem of IR Drop, and can improve display uniformity of the display panel.

The opening provided in the pixel definition layer between adjacent pixel regions may have a rectangular shape extending along a traveling direction of the pixel definition layer where the opening is located, its length may be equal to a length of its adjacent pixel region, and its width may be in a range of 100-200 μm.

FIG. 3 illustrates an embodiment in which an opening 12 is provided in the pixel definition layer between two adjacent pixel regions in a horizontal direction. However, the present disclosure is not limited thereto. For example, the opening may be provided in the pixel definition layer between two pixel adjacent regions in a longitudinal direction, or the opening may be provided at an intersection of one horizontal extending part and one longitudinal extending part of the pixel definition layer. In whichever case, it is only necessary to provide the connection electrode on the second substrate at a predetermined position corresponding to the position of the opening on the first substrate, so that after the first substrate and the second substrate are assembled, the connection electrode at the predetermined position on the second substrate will go deep into the opening to be electrically coupled to the second electrode of the OLED adjacent to the opening, or will cause second electrodes of multiple OLEDs adjacent to the opening to be electrically coupled together with each other.

In order to further reduce the total resistance of cathodes electrically coupled to each other together, a material of low resistivity is selected as the material of the connection electrode 21.

It is to be noted herein that, in the present embodiment, the connection electrode 21 does not necessarily completely fill the opening 12, as long as it can electrically connect cathodes 15 of two adjacent OLEDs. The connection electrode 21 may completely fill the opening 12, to further reduce the total resistance of cathodes 15 electrically coupled to each other together.

The above embodiments have been described taking an example where the connection electrode is provided on the second substrate, but the present disclosure is not limited thereto. It is also possible to provide the connection electrode on the first substrate and locate the connection electrode in the opening of the pixel definition layer.

It is to be noted herein that, in a case where the connection electrode is provided on the second substrate different from the first substrate on which the OLEDs are provided, a signal introduction line 100 which inputs signals to the cathodes 15 may be provided in a peripheral area of the second base 20, and the signal introduction line 100 may be connected in series with the connection electrode 21, which can relieve wiring stress on the first base 10, as shown in FIG. 1.

Figure 2:
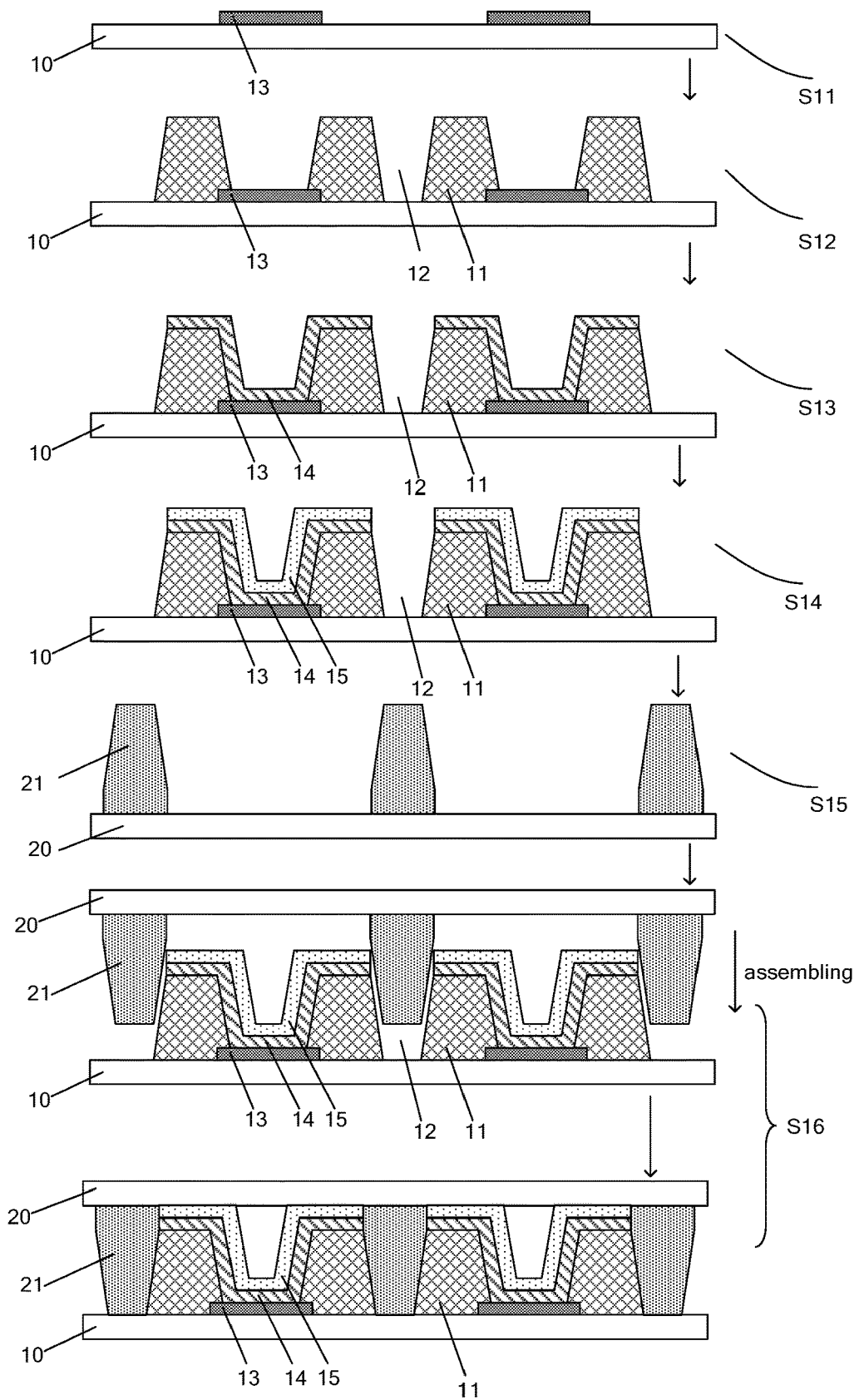
FIG. 2 is a process flow diagram of a manufacturing method of a display panel according to an embodiment of the present disclosure.

With respect to the above display panel, the present embodiment also provides a manufacturing method of the display panel, as shown in FIG. 2, which includes steps S11 to S16.

At step S1, a pattern including anodes 13 of OLEDs is formed on the first base 10 by a patterning process.

Herein, it should be understood that, before the anodes 13 of the OLEDs are formed, the first base 10 should be formed with structures such as a driving element for driving the OLED to emit light, for example, a thin film transistor, a storage capacitor, etc.

At step S12, on the first base 10 subjected to the above step, by a patterning process, a patterned pixel definition layer 11 is formed to define pixel regions for accommodating the OLEDs, and an opening 12 is formed in the pixel definition layer 11 to be located between two adjacent pixel regions; as shown in FIG. 2, the pixel definition layer for defining pixel regions forms a plurality of accommodation parts, and the anodes 13 are exposed at the accommodation parts.

At step S13, light emitting layers 14 of the OLEDs are formed on the first base 10 subjected to the above step. In the embodiment shown in FIG. 2, the light emitting layer 14 is not formed at the opening 12, the light emitting layer 14 is formed only on the anode 13 in the pixel region defined by the pixel definition layer 11 and on a side surface of the pixel definition layer around the pixel region. However, the present disclosure is not limited thereto, the light emitting layer may also be formed on the first base 10 in the opening, but the light emitting layer above the opening is disconnected.

The light emitting layers 14 of the OLEDs may be formed by inkjet printing. Of course, the present disclosure is not limited thereto, and a process such as evaporation plating may also be employed to form the light emitting layer.

At step S14, cathodes 15 of the OLEDs are formed on the first base 10 subjected to the above step. The cathode 15 and the light emitting layer 14 of each OLED should be conformal, and be disconnected at or above the opening 12.

In this step, the cathodes 15 of the OLEDs may be formed by deposition such as evaporation plating, sputtering or the like.

The cathode 15 of the OLED may be transparent, for example, may be a monolayer cathode 15 made of a material such as Mg:Ag, IZO, ITO, AZO, or the like, or may be a multilayer cathode 15 made of a thin layer of a transparent material such as Mg:Ag, Ag and a material such as IZO, ITO, AZO. When the cathode 15 is a monolayer transparent cathode 15, its thickness is about 10-100 nm; when the cathode 15 is a multilayer transparent cathode 15, the thin layer of the transparent material such as Mg:Ag, Ag as a first layer of the cathode 15 is located at a side of the light emitting layer, with a thickness of about 2-20 nm, while the material such as IZO, ITO, AZO covers the thin layer of the transparent material, with a thickness ranging from 10-100 nm.

At step S15, a connection electrode material 210 is formed on the second base 20 at a position corresponding to the opening 12 on the first substrate.

The connection electrode material 210 may be formed on the second base 20, at the position corresponding to the opening 12 on the first substrate, by a screen printing method; the connection electrode material 210 may be silver paste.

At step S16, the first base 10 formed with the cathodes 15 of the OLEDs and the second base 20 formed with the connection electrode material 210 are aligned and assembled, such that the connection electrode material 210 fills the opening 12 to form the connection electrode 21 which causes the cathodes 15 of the OLEDs adjacent to the opening to be electrically coupled to each other together, and the display panel is obtained.

This step may specifically employ a vacuum alignment method to assemble the first base 10 formed with the cathodes 15 of the OLEDs with the second base 20 formed with the connection electrode material 210, such that the connection electrode material 210 fills the opening 12, after which a baking method is used to bake the connection electrode material 210 dry, to form the connection electrode 21. The cathodes 15 of the OLEDs are thus electrically coupled to each other together, to obtain the display panel.

It is to be noted herein that, the step S15 may be performed before the step S11. That is, the second substrate may be formed first.

Figure 10:
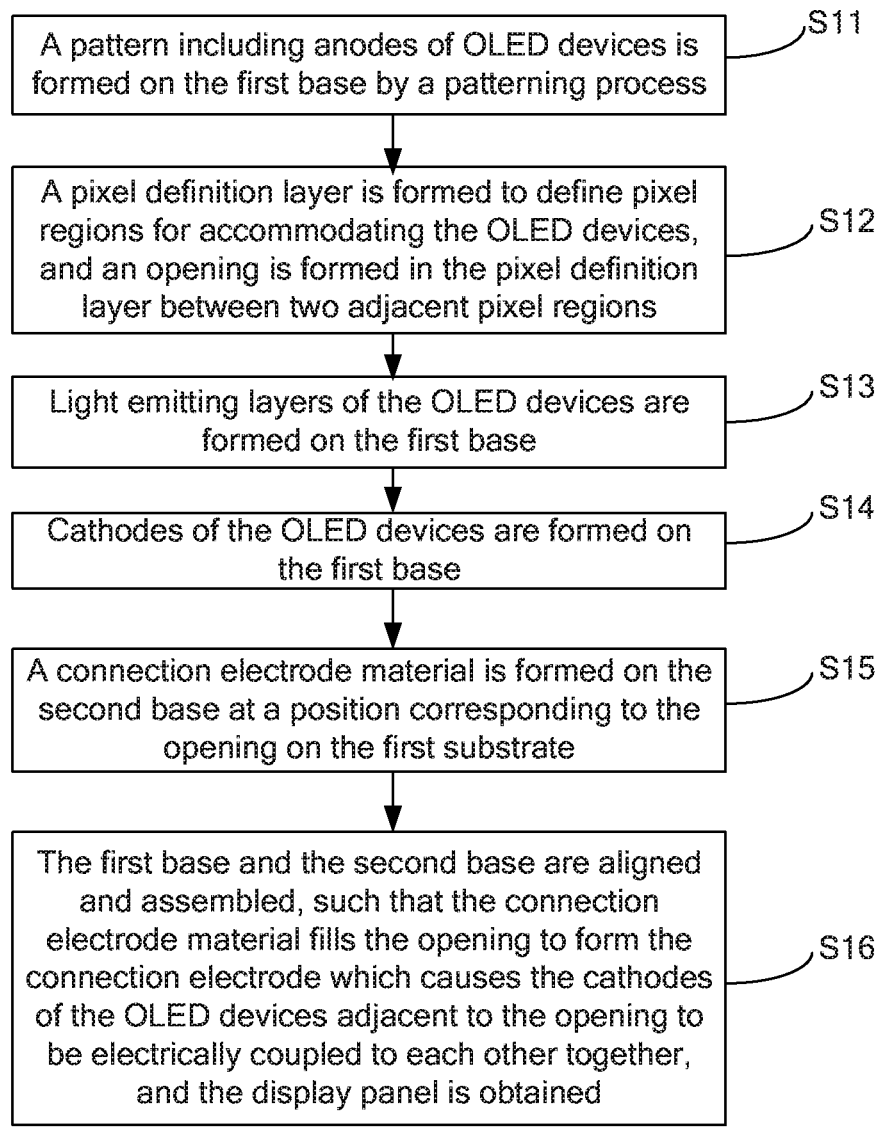
FIG. 10 is a flow chart of a manufacturing method of a display panel according to an embodiment of the present disclosure.

FIG. 10 illustrates a flow chart of the above-described manufacturing method of the display panel.

An embodiment of the present disclosure provides a display panel, including: a first substrate and a second substrate provided opposite to each other.

Figure 4:
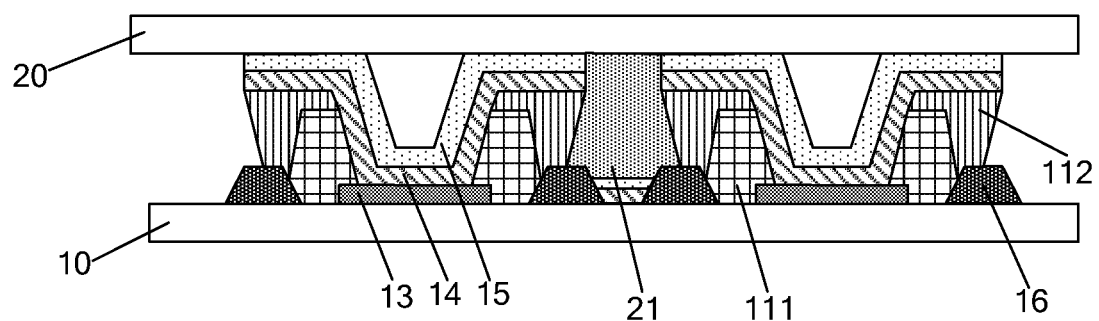
FIG. 4 is a schematic diagram of a structure of a display panel according to an embodiment of the present disclosure.

The first substrate includes a first base 10 and a pixel definition layer 11 located on the first base 10, and pixel regions are defined by the pixel definition layer 11 to accommodate OLEDs; each of the OLEDs includes an anode 13, a light emitting layer 14, and a cathode 15 sequentially disposed along a direction directed away from the first base 10; the pixel definition layer between adjacent pixel regions includes one opening 12; an auxiliary electrode 16 is provided on the first base 10 located in the opening 12, as shown in FIG. 4. The auxiliary electrode 16 in the opening 12 shown in FIG. 4 may be an annular auxiliary electrode, such as a circular or rectangular annular shape or the like.

The second substrate includes a second base 20, and a connection electrode 21, which is located on a side of the second base 20 proximal to the pixel definition layer, at a position corresponding to a position of the opening 12; the connection electrode 21 is provided inside the opening 12, to electrically couple cathodes 15 of OLEDs adjacent to the opening 12 together via the auxiliary electrode 16 and the connection electrode 21.

Since the auxiliary electrode 16 is provided in the opening 12 on the first substrate of the display panel of the present embodiment; the second substrate includes the connection electrode 21 which is disposed at a position corresponding to the opening 12 on the first substrate, the connection electrode 21 may fill the opening 12. The cathodes 15 of the OLEDs adjacent to the opening 12 may be electrically coupled to each other together via the connection electrode 21 and the auxiliary electrode 16. In general, a depth of the opening 12 is far greater than a thickness of the cathode 15 of the OLED, thus, the resistance of the connection electrode 21 of a unit length is far less than the resistance of the cathode 15 of a unit length; as such, with cathodes 15 of adjacent OLEDs electrically coupled to each other via the connection electrode 21, compared to a planar electrode in the display panel in the related art (cathodes 15 of OLEDs are of an integrated structure), the total resistance of the cathodes 15 of the OLEDs in the present embodiment which are electrically coupled to each other is significantly reduced. Moreover, the auxiliary electrode 16 is formed in the opening 12, the auxiliary electrode 16 may also assist in the electrical connection between the connection electrode 21 and the cathode 15 of the OLED, thus can effectively eliminate the problem of IR Drop.

In the present embodiment, an orthographic projection of the pixel definition layer 11 on the first base 10 covers an orthographic projection of the auxiliary electrode 16 on the first base 10. That is, an included angle between a surface of the pixel definition layer 11 distal to the first base 10 and a side surface of the pixel definition layer 11 defining the opening 12 is an acute angle. As such, when forming cathodes 15 of the OLEDs on the pixel definition layer 11, an entire layer of the cathode material may be formed, and this entire layer of the cathode material is disconnected at an edge of the pixel definition layer 11. Thus, cathodes 15 of the respective OLEDs may be formed by one process. It is to be noted herein that, the cathode material on the surface of the pixel definition layer 11 distal to the first base 10 is connected to the cathode material at the position corresponding to the OLED, that is, the cathode of each OLED will extend to an upper surface of the pixel definition layer 11.

Of course, the orthographic projection of the pixel definition layer 11 on the first base 10 may partially cover the orthographic projection of the auxiliary electrode 16 on the first base 10, as long as the included angle between a surface of the pixel definition layer 11 distal to the first base 10 and a side surface of the pixel definition layer 11 defining the opening 12 is an acute angle. This can satisfy that, when forming cathodes 15 of the OLEDs on the pixel definition layer 11, a cathode material layer is disconnected at an edge of the pixel definition layer 11. As such, cathodes 15 of the respective OLEDs may be formed by one process. In this case, in the opening 12, an organic light emitting material and a cathode material may be formed sequentially along a direction directed away from the first base 10. Of course, the light emitting material and the cathode material may not be formed in the opening 12.

The structure of the display panel of the present embodiment is described below in conjunction with structures of two types of pixel definition layers, and positional relationship between the pixel definition layer 11 and the auxiliary electrode 16.

As a first implementation of the present embodiment, as shown in FIG. 4, the pixel definition layer 11 on the first substrate is a two-layer structure. Specifically, the pixel definition layer 11 includes a first pixel definition sub-layer 111 and a second pixel definition sub-layer 112 provided sequentially along a direction directed away from the first base 10; the first pixel definition sub-layer 111 contacts the auxiliary electrode 16; an orthographic projection of the second pixel definition sub-layer 112 on the first base 10 completely covers an orthographic projection of the auxiliary electrode 16 on the first base 10, and partially covers an orthographic projection of the first pixel definition sub-layer 111 on the first base 10.

The reason for employing the pixel definition layer 11 of the two-layer structure is that, when cathodes 15 of the respective OLEDs are required to be formed in one process, the height of the pixel definition layer of a one-layer structure should be high enough to ensure that the cathode material layer is disconnected at the edge of the pixel definition layer, however, due to the process limitation, it is difficult to form the pixel definition layer of the one-layer structure having a sufficient height, thus in the present embodiment, the pixel definition layer 11 is formed to have two parts: the first pixel definition sub-layer 111 and the second pixel definition sub-layer 112 provided sequentially along a direction directed away from the first base 10.

Figure 5:
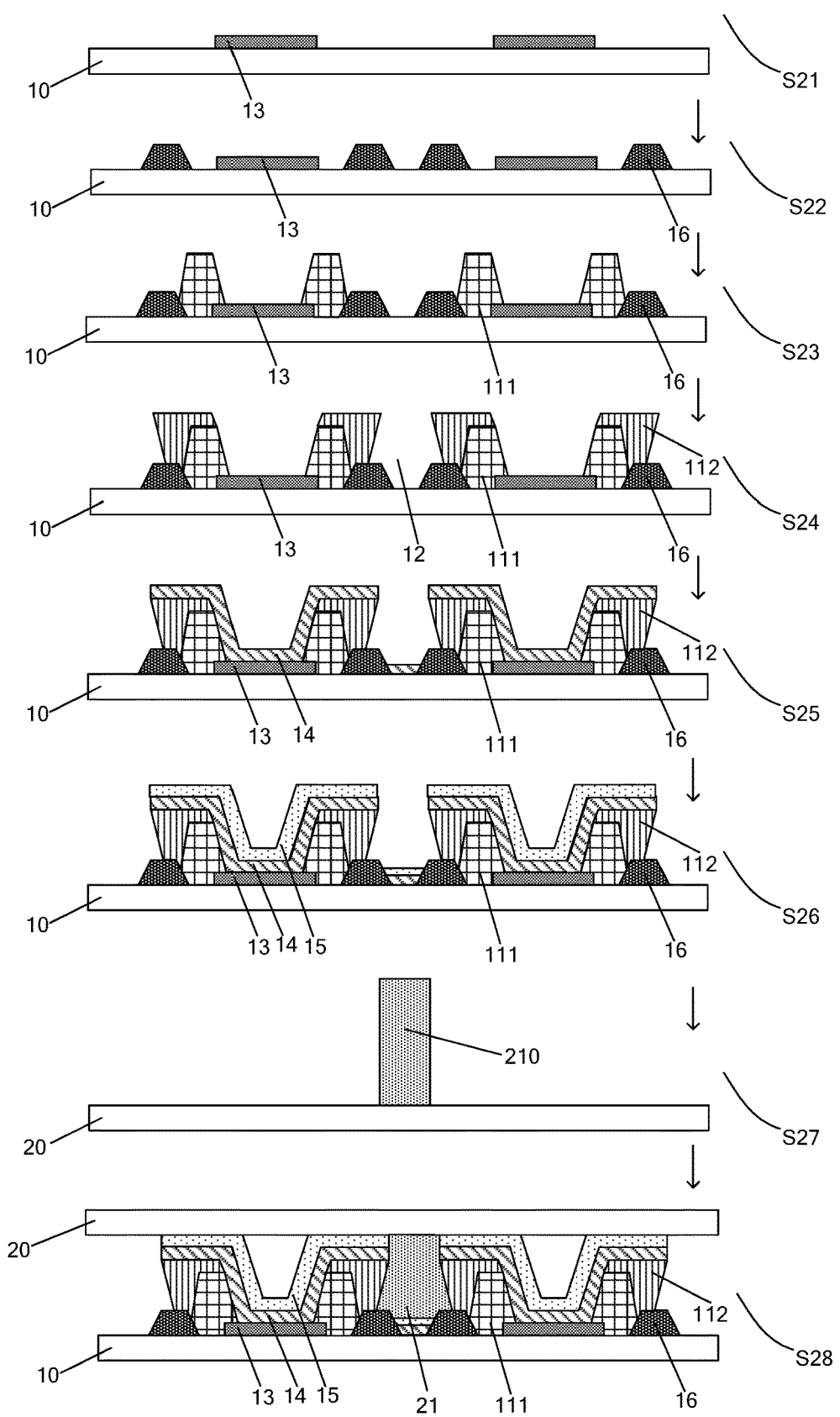
FIG. 5 is a process flow diagram of a manufacturing method of a display panel according to an embodiment of the present disclosure.

The manufacturing method of the display panel of this embodiment is described below in conjunction with FIG. 5. As shown in FIG. 5, the method includes steps S21 to S28.

At step S21, a pattern including anodes 13 of OLEDs is formed on the first base 10 by a patterning process.

Herein, it should be understood that, before forming the anodes 13 of the OLEDs, the first base 10 should be formed with structures such as a driving element for driving the OLED to emit light, for example, a thin film transistor, a storage capacitor, etc.

Figure 6:
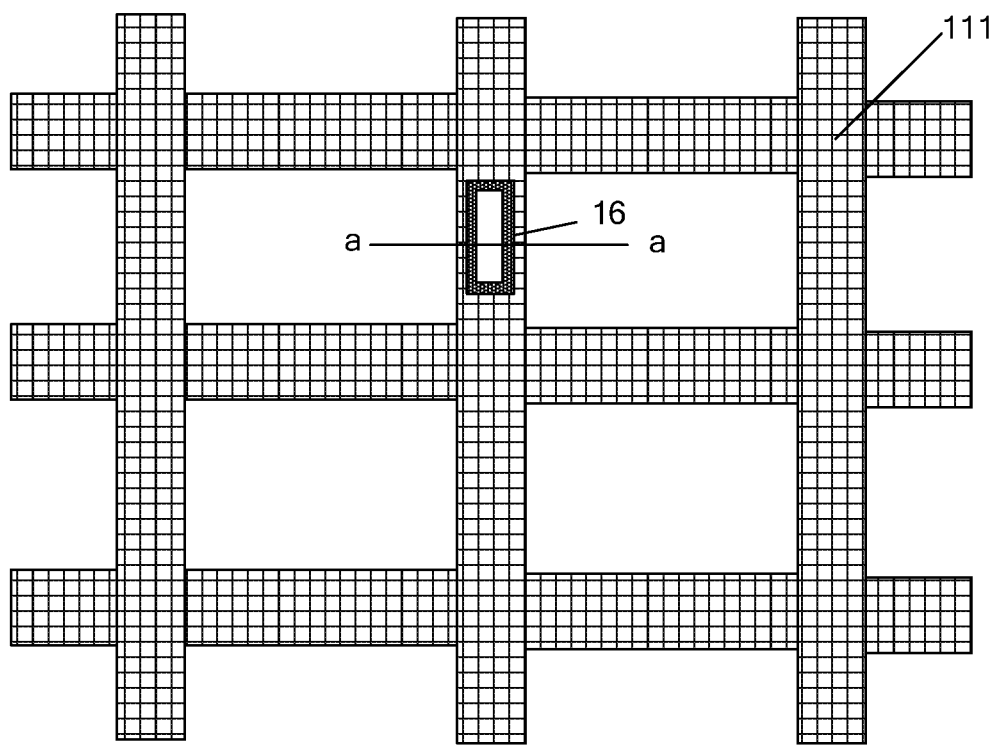
FIG. 6 is a schematic plan view of a display panel according to an embodiment of the present disclosure.

At step S22, on the first base 10 subjected to the above step, a pattern including the auxiliary electrode 16 is formed by a patterning process. Referring to FIG. 6, the auxiliary electrode 16 may be an annular auxiliary electrode 16 provided between two adjacent anodes. The embodiment shown in FIG. 6 illustrates a rectangular annular auxiliary electrode 16. However, the present disclosure is not limited thereto, and a circular annular auxiliary electrode 16 may also be possible.

The auxiliary electrode 16 formed in this step has a trapezoid cross section along a direction perpendicular to the first base 10. A material of the auxiliary electrode 16 may include any one of Mo, Mo/Al/Mo, Cu, or Ag, but the present disclosure is not limited thereto.

At step S23, on the first base 10 subjected to the above step, a pattern including a first pixel definition sub-layer 111 is formed by a patterning process. The first pixel definition sub-layer 111 is formed between the anode 13 and the auxiliary electrode 16 to surround the anode 13, and the first pixel definition sub-layer 111 is in contact with the auxiliary electrode 16.

The first pixel definition sub-layer 111 formed in this step has a thickness in a range of 0.2-1.5 μm. The formed first pixel definition sub-layer 111 has a trapezoid cross section along a direction perpendicular to the first base 10.

At step S24, on the first base 10 subjected to the above step, a pattern including a second pixel definition sub-layer 112 is formed by a patterning process. a surface of the second pixel definition sub-layer 112 proximal to the first base 10 completely covers a surface of the first pixel definition sub-layer 111 distal to the first base 10 and partially covers a surface of the auxiliary electrode 16 distal to the first base 10; an orthographic projection of the second pixel definition sub-layer 112 on the first base 10 completely covers an orthographic projection of the auxiliary electrode 16 on the first base 10.

It is to be noted herein that, the surface of the second pixel definition sub-layer 112 proximal to the first base 10 is arranged to completely cover the surface of the first pixel definition sub-layer 111 distal to the first base 10, in order to prevent a step from being formed on a contact surface between the first pixel definition sub-layer 111 and the second pixel definition sub-layer 112, which may avoid subsequent disconnection between the cathode material on the surface of the pixel definition layer 11 distal to the first base 10 and the cathode material at a position corresponding to the OLED.

The second pixel definition sub-layer 112 formed in this step has a thickness in a range of 0.2-1.5 μm.

At step S25, light emitting layers 14 of the OLEDs are formed on the first base 10 subjected to the above step. At this time, a light emitting material may be also formed in the opening 12.

The light emitting layers 14 of the OLEDs may be formed by employing an inkjet printing process. Of course, the process for forming the light emitting layer 14 is not limited thereto, and a process such as evaporation plating may also be employed.

At step S26, cathodes 15 of the OLEDs are formed on the first base 10 subjected to the above step. The cathode 15 of each OLED is broken, cracked or disconnected at the position of the opening 12. At this time, a cathode material may be also formed on the light emitting material in the opening 12.

In this step, the cathodes 15 of the OLEDs may be formed by deposition such as evaporation plating, sputtering or the like.

The cathode 15 of the OLED may be transparent, for example, may be a monolayer cathode 15 made of a material such as Mg:Ag, IZO, ITO, AZO, or the like, or may be a multilayer cathode 15 made of a thin layer of a transparent material such as Mg:Ag, Ag and a material such as IZO, ITO, AZO. When the cathode 15 is a monolayer transparent cathode 15, its thickness is about 10-100 nm; when the cathode 15 is a multilayer transparent cathode 15, the thin layer of the transparent material such as Mg:Ag, Ag as a first layer of the cathode 15 is located at a side of the light emitting layer, with a thickness of about 2-20 nm, while the material such as IZO, ITO, AZO covers the thin layer of the transparent material, with a thickness ranging from 10-100 nm.

At step S27, a connection electrode material 210 is formed on the second base 20, at a position corresponding to the opening 12 on the first substrate.

The connection electrode material 210 may be formed on the second base 20, at the position corresponding to the opening 12 on the first substrate, by a screen printing method; the connection electrode material 210 may be silver paste.

At step S28, the first base 10 formed with the cathodes 15 of the OLEDs and the second base 20 formed with the connection electrode material 210 are aligned and assembled, such that the connection electrode material 210 fills the opening 12 to form the connection electrode 21, which causes the cathodes 15 of the OLEDs adjacent to the opening to be electrically coupled to each other together via the auxiliary electrode 16, and the display panel is obtained.

This step may specifically employ a vacuum alignment method to assemble the first base 10 formed with the cathodes 15 of the OLEDs with the second base 20 formed with the connection electrode material 210, such that the connection electrode material 210 fills the opening 12, after which a baking process is used to bake the connection electrode material 210 dry, to form the connection electrode 21. The cathodes 15 of the OLEDs are thus electrically coupled to each other together, to obtain the display panel.

It is to be noted herein that, the step S27 may be performed before the step S21. That is, the second substrate may be formed first.

Figure 11:
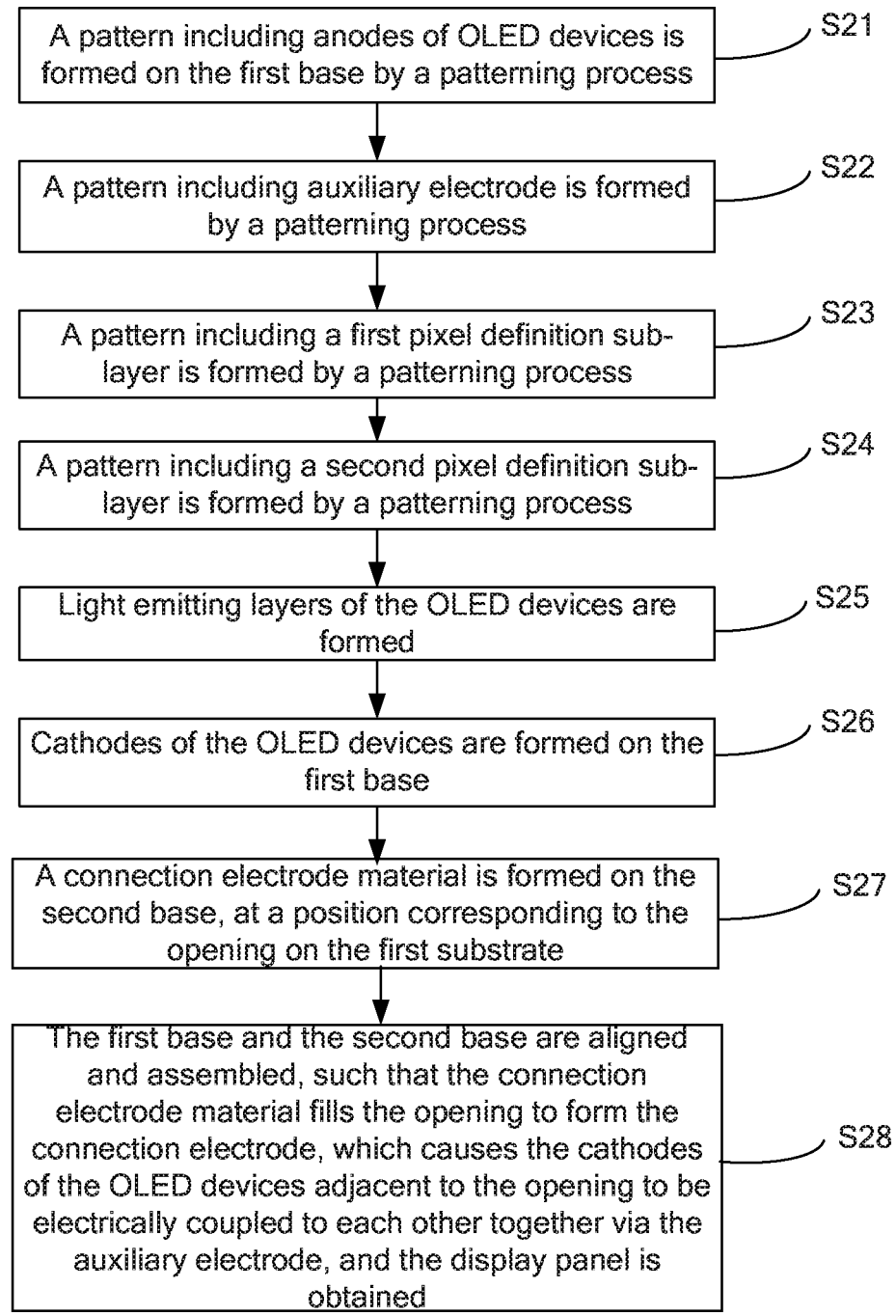
FIG. 11 is a flow chart of a manufacturing method of a display panel according to an embodiment of the present disclosure.

FIG. 11 illustrates a flow chart of the above-described manufacturing method of the display panel.

Figure 7:
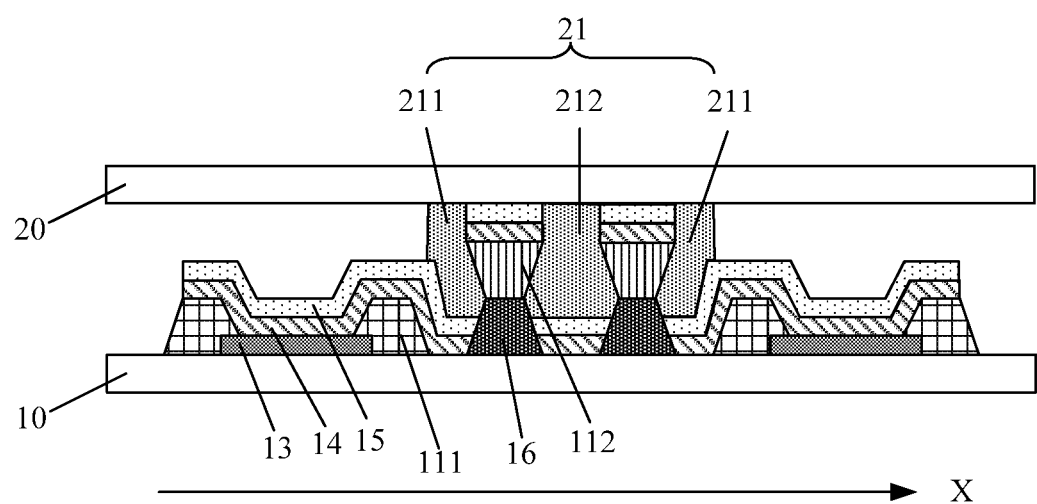
FIG. 7 is a schematic diagram of a structure of a display panel according to an embodiment of the present disclosure.

FIG. 7 illustrates a display panel according to an embodiment of the present disclosure. As shown in FIG. 7, a pixel definition layer 111 on the first base 10 of the first substrate is spaced apart from the auxiliary electrode 16, a dam 112 is provided on the auxiliary electrode 16, and a cross section of the dam 112 along a direction perpendicular to the first base is an inverted trapezoid. In a case where the auxiliary electrode 16 is an annular auxiliary electrode which is located in the opening and spaced apart from the pixel definition layer as described in the foregoing embodiment, the dam 112 provided thereon in this embodiment is also an annular dam.

Figure 8:
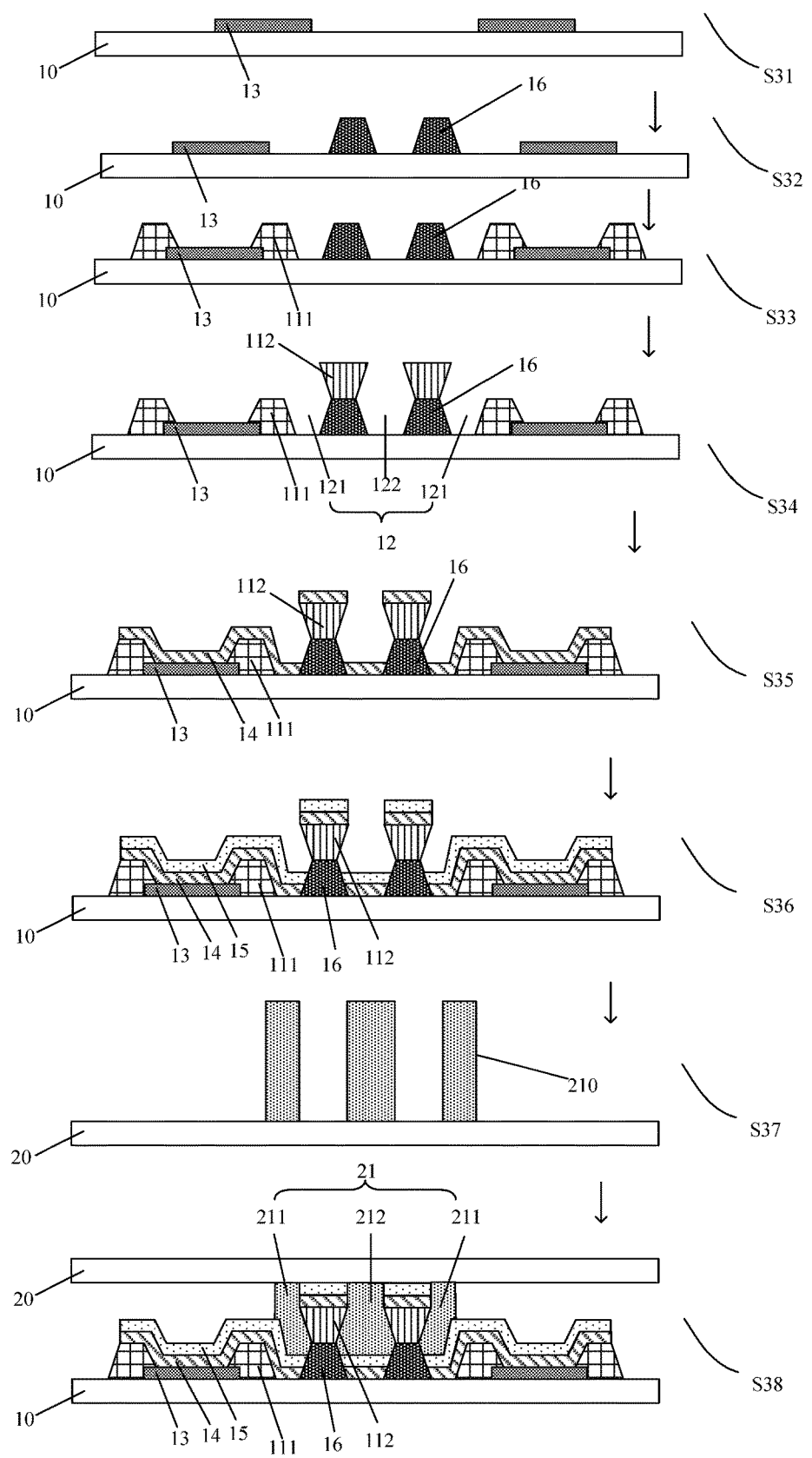
FIG. 8 is a process flow diagram of a manufacturing method of a display panel according to an embodiment of the present disclosure.
Figure 9:
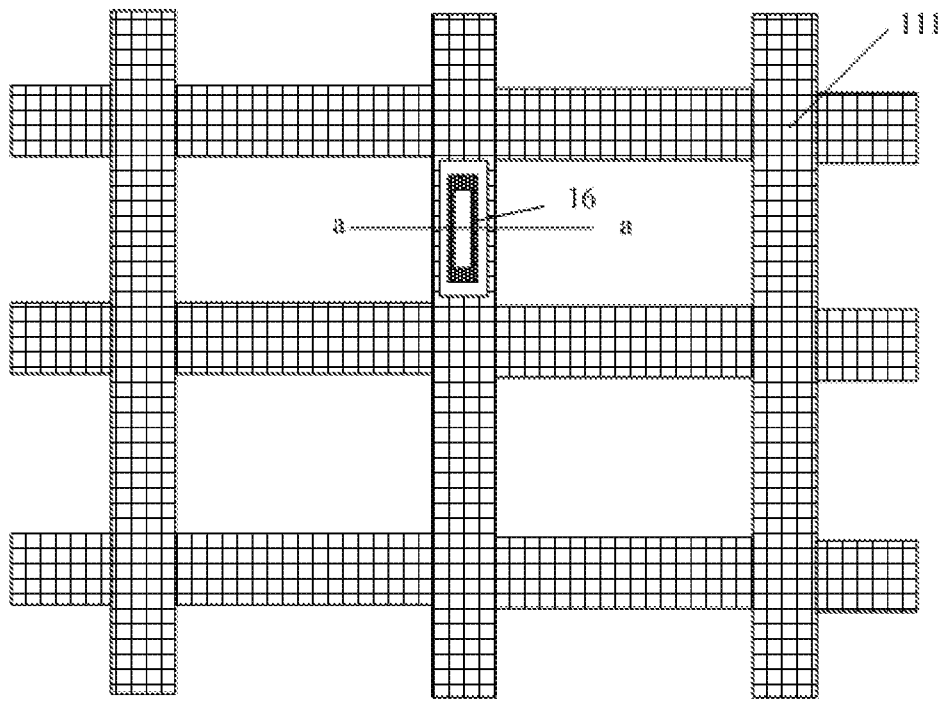
FIG. 9 is a schematic plan view of a display panel according to an embodiment of the present disclosure.

Accordingly, the connection electrode 21 on the second base 20 includes a first connection sub-electrode 212 located inside the annular auxiliary electrode 16 and the annular dam 112, and a second connection sub-electrode 211 located outside the annular auxiliary electrode 16 and the annular dam 112; cathodes 15 of adjacent OLEDs at positions corresponding to the opening 12 (each opening 12 includes a first sub-opening 121 and a second sub-opening 122, as shown in FIGS. 8 and 9) are electrically coupled to each other via the auxiliary electrode 16, the first connection sub-electrode 212, and the second connection sub-electrode 211.

In this embodiment, the dam 112 may also be considered as one layer constituting a pixel definition layer, and its combination with the pixel definition layer 111 may be considered as the pixel definition layer of a two-layer structure. As described in the foregoing embodiment, the reason for employing the pixel definition layer of the two-layer structure is that, when cathodes 15 of the respective OLEDs are required to be formed in one process, the height of the pixel definition layer of a one-layer structure should be high enough to ensure that the cathode material layer is disconnected at the edge of the pixel definition layer, however, due to the process limitation, it is difficult to form the pixel definition layer of the one-layer structure having a sufficient height, thus in the present embodiment, the pixel definition layer is manufactured to have two parts: the first pixel definition layer 111 and the dam 112 provided sequentially along a direction directed away from the first base 10, to realize the pixel definition layer of the two-layer structure.

The manufacturing method of the display panel of this embodiment is described below in conjunction with FIG. 8. As shown in FIG. 8, the method includes steps S31 to S38.

At step S31, a pattern including anodes 13 of OLEDs is formed on the first base 10 by a patterning process.

Herein, it should be understood that, before the anodes 13 of the OLEDs are formed, the first base 10 should be formed with structures such as a driving element for driving the OLED to emit light, for example, a thin film transistor, a storage capacitor, etc.

At step S32, on the first base 10 subjected to the above step, a pattern including the auxiliary electrode 16 is formed by a patterning process. Similar to the foregoing embodiment, the auxiliary electrode 16 may be an annular auxiliary electrode provided between two adjacent cathodes.

The auxiliary electrode 16 formed in this step has a trapezoid cross section along a direction perpendicular to the first base 10. A material of the auxiliary electrode 16 may include any one of Mo, Mo/Al/Mo, Cu, or Ag. However, the present disclosure is not limited thereto.

At step S33, on the first base 10 subjected to the above step, a pattern including a pixel definition layer 111 is formed by a patterning process. The pixel definition layer 111 is formed between the anode 13 and the auxiliary electrode 16, and the pixel definition layer 111 is not in contact with the auxiliary electrode 16, as shown in FIG. 9.

The pixel definition layer 111 formed in this step has a thickness in a range of 0.2-1.5 μm. The pixel definition layer 111 has a trapezoid cross section along a direction perpendicular to the first base 10.

At step S34, on the first base 10 subjected to the above step, a pattern including a dam 112 is formed on the auxiliary electrode 16 by a patterning process. A surface of the dam 112 proximal to the first base 10 completely covers a surface of the auxiliary electrode 16 distal to the first base 10, and the dam 112 has an inverted trapezoid cross section along a direction perpendicular to the first base 10; in this case, a first sub-opening 121 of the opening 12 is defined between the pixel definition layer 111 and the auxiliary electrode 16, and a second sub-opening 122 of the opening 12 is defined by the auxiliary electrode 16, as shown in FIGS. 7 to 9, and each opening 12 includes the first sub-opening 121 and the second sub-opening 122.

The dam 112 formed in this step has a thickness in a range of 0.2-1.5 μm.

At step S35, light emitting layers 14 of the OLEDs are formed on the first base 10 subjected to the above step, and a light emitting material is formed in both the first sub-opening 121 and the second sub-opening 122.

The light emitting layers 14 of the OLEDs may be formed by employing an inkjet printing process. Of course, the process for forming the light emitting layer 14 is not limited thereto, and a process such as evaporation plating may also be employed.

At step S36, cathodes 15 of the OLEDs are formed on the first base 10 subjected to the above step. The cathode 15 of each OLED is disconnected at a position of an edge of the surface of the dam 112 distal to the first base 10. A cathode material is formed on the light emitting material in both the first sub-opening 121 and the second sub-opening 122.

In this step, the cathode material layer of the OLEDs may be formed by deposition such as evaporation plating, sputtering or the like. The cathode material layer is disconnected at the position of the edge of the surface of the dam 112 distal to the first base 10, to form the cathode 15 of each OLED.

The cathode 15 of the OLED may be transparent, for example, may be a monolayer cathode 15 made of a material such as Mg:Ag, IZO, ITO, AZO, or the like, or may be a multilayer cathode 15 made of a thin layer of a transparent material such as Mg:Ag, Ag and a material such as IZO, ITO, AZO. When the cathode 15 is a monolayer transparent cathode 15, its thickness is about 10-100 nm; when the cathode 15 is a multilayer transparent cathode 15, the thin layer of the transparent material such as Mg:Ag, Ag as a first layer of the cathode 15 is located at a side of the light emitting layer, with a thickness of about 2-20 nm, while the material such as IZO, ITO, AZO covers the thin layer of the transparent material, with a thickness ranging from 10-100 nm.

At step S37, a connection electrode material 210 is formed on the second base 20, at positions corresponding to the first sub-opening 121 and the second sub-opening 122 on the first substrate.

The connection electrode material 210 may be formed on the second base 20 at positions corresponding to the first sub-opening 121 and the second sub-opening 122 on the first substrate, by a screen printing method; the connection electrode material 210 may be silver paste.

At step S38, the first base 10 formed with the cathodes 15 of the OLEDs and the second base 20 formed with the connection electrode material 210 are aligned and assembled, such that the connection electrode material 210 fills the first sub-opening 121 and the second sub-opening 122 to form the first connection sub-electrode 211 and the second connection sub-electrode 212, which cause the cathodes 15 of the OLEDs adjacent to the opening to be electrically coupled to each other together via the auxiliary electrode 16, and the display panel is obtained.

This step may specifically employ a vacuum alignment method to assemble the first base 10 formed with the cathodes 15 of the OLEDs with the second base 20 formed with the connection electrode material 210, such that the connection electrode material 210 fills the first sub-opening 121 and the second sub-opening 122, after which a baking process is used to bake the connection electrode material 210 dry, to form the first connection sub-electrode 211 and the second connection sub-electrode 212. The cathodes 15 of the OLEDs are thus electrically coupled to each other together, to obtain the display panel. It is to be noted herein that, the step S37 may be performed before the step S31. That is, the second substrate may be formed first.

Figure 12:
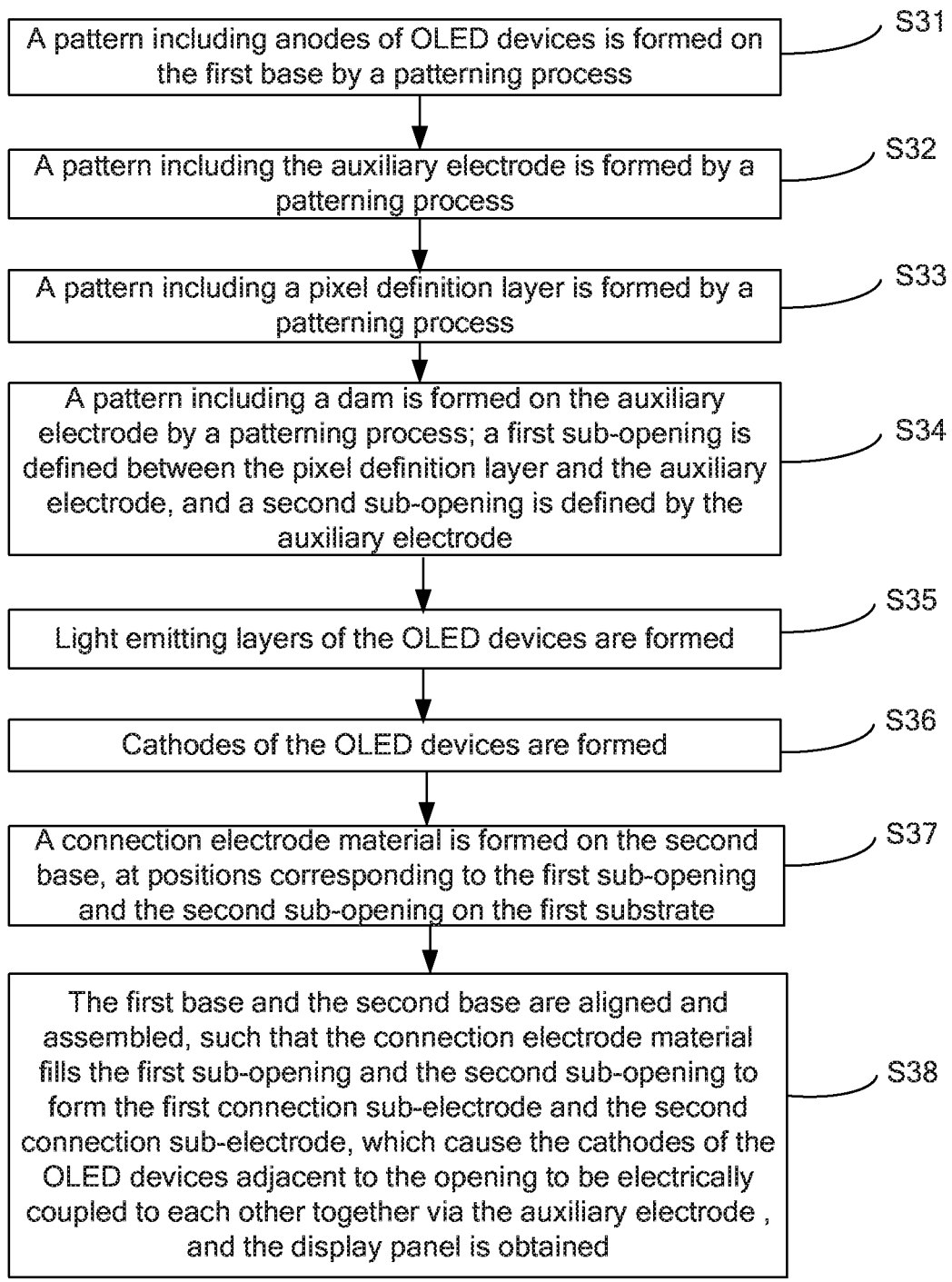
FIG. 12 is a flow chart of a manufacturing method of a display panel according to an embodiment of the present disclosure.

FIG. 12 illustrates a flow chart of the above-described manufacturing method of the display panel.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A display panel, comprising a first substrate and a second substrate provided opposite to each other; wherein
the first substrate comprises a first base, and a pixel definition layer on the first base, and at least one organic light emitting diode, each of the at least one organic light emitting diode comprises a first electrode, a light emitting layer, and a second electrode sequentially provided along a direction directed away from the first base, and the pixel definition layer defines a plurality of pixel regions spaced apart from each other, the at least one organic light emitting diode is provided in the pixel regions, respectively, and an opening is disposed between at least two adjacent pixel regions in the pixel definition layer; and
the second substrate comprises a second base and a connection electrode on a side of the second base proximal to the pixel definition layer, and the connection electrode is inside the opening, and is in physical contact with at least two second electrodes of at least two organic light emitting diodes in the at least two adjacent pixel regions such that the at least two second electrodes at positions adjacent to the opening are electrically coupled to each other via the connection electrode.

2. The display panel according to claim 1, wherein the connection electrode fills the opening and is in contact with the second base.

3. The display panel according to claim 1, wherein the first substrate further comprises at least one auxiliary electrode in the opening, and the at least one auxiliary electrode is in physical contact with the connection electrode.

4. The display panel according to claim 3, wherein an orthographic projection of the pixel definition layer on the first base covers an orthographic projection of the at least one auxiliary electrode on the first base.

5. The display panel according to claim 4, wherein the at least one auxiliary electrode comprises an annular auxiliary electrode, and the annular auxiliary electrode is arranged in the opening and in contact with the pixel definition layer.

6. The display panel according to claim 5, wherein the pixel definition layer comprises a first pixel definition sub-layer and a second pixel definition sub-layer provided sequentially along a direction directed away from the first base; and
an orthographic projection of the second pixel definition sub-layer on the first base completely covers the orthographic projection of the at least one auxiliary electrode on the first base, and the orthographic projection of the second pixel definition sub-layer on the first base completely partially covers an orthographic projection of the first pixel definition sub-layer on the first base.

7. The display panel according to claim 6, wherein a light emitting material of the light emitting layer and an electrode material of the second electrode are provided sequentially on the first base in the opening along the direction directed away from the first base, and each of a height of the light emitting material of the light emitting layer and a height of the electrode material of the second electrode is smaller than a height of the at least one auxiliary electrode.

8. The display panel according to claim 3, wherein the at least one auxiliary electrode is spaced apart from the pixel definition layer, and a dam is provided on the at least one auxiliary electrode, and a cross section of the dam along a direction perpendicular to the first base is an inverted trapezoid.

9. The display panel according to claim 8, wherein the at least one auxiliary electrode in the opening comprises an annular auxiliary electrode in the opening and spaced apart from the pixel definition layer, and the dam provided on the annular auxiliary electrode is an annular dam;
the connection electrode comprises a first connection sub-electrode inside the annular auxiliary electrode and the annular dam, and a second connection sub-electrode located outside the annular auxiliary electrode and the annular dam; and
second electrodes of organic light emitting diodes adjacent to the opening are electrically coupled to each other via the at least one auxiliary electrode, the first connection sub-electrode, and the second connection sub-electrode.

10. The display panel according to claim 9, wherein a light emitting material of the light emitting layer and an electrode material of the second electrode are provided sequentially inside the annular auxiliary electrode in the opening along a direction directed away from the first base.

11. The display panel according to claim 1, wherein the opening provided in the pixel definition layer between two adjacent pixel regions has a rectangular shape extending along a traveling direction of the pixel definition layer at which the opening is located, a length of the opening is about equal to a length of each of the two adjacent pixel regions, and a width of the opening is in a range of about 100-200 μm.

12. A manufacturing method of a display panel, comprising:
forming a first substrate, wherein the first base comprises a pattern comprising a pixel definition layer on a first base, the pixel definition layer defines a plurality of pixel regions spaced apart from each other, at least one organic light emitting diode is respectively formed in the pixel regions, each of the at least one organic light emitting diode comprises a first electrode, a light emitting layer, and a second electrode sequentially formed along a direction directed away from the first base, and an opening is disposed between at least two adjacent pixel regions in the pixel definition layer;
forming a second substrate, wherein the second substrate comprises a connection electrode material at a predetermined position on a second base;
aligning and assembling the first substrate and the second substrate, wherein the connection electrode material is arranged in the opening to be in physical contact with at least two second electrodes of at least two organic light emitting diodes in the at least two adjacent pixel regions such that the at least two second electrodes at positions adjacent to the opening are electrically coupled to each other via the connection electrode.

13. The manufacturing method of the display panel according to claim 12, wherein the forming the second substrate comprises:
forming the connection electrode material on the second base at a position corresponding to the opening by a screen printing process; and
after aligning and assembling the first substrate and the second substrate, the manufacturing method of the display panel further comprises: baking the connection electrode material in the opening dry by a baking process to form the connection electrode.

14. The manufacturing method of the display panel according to claim 12, wherein the forming the first substrate comprises:
forming at least one auxiliary electrode on the first base at a position corresponding to the opening, after aligning and assembling the first substrate and the second substrate, second electrodes of organic light emitting diodes adjacent to the opening are electrically coupled to each other via the at least one auxiliary electrode and the connection electrode.

15. The manufacturing method of the display panel according to claim 14, wherein an orthographic projection of the pixel definition layer on the first base covers an orthographic projection of the at least one auxiliary electrode on the first base.

16. The manufacturing method of the display panel according to claim 12, wherein the forming the first substrate comprises:
forming, on the first base, a pattern comprising the first electrode of each of the at least one organic light emitting diode by a patterning process;
forming, on the first base subjected to the above step, by a patterning process, a pattern comprising a pixel definition layer, wherein the pixel definition layer defines a plurality of pixel regions spaced apart each other for accommodating the at least one organic light emitting diode, and the pixel definition layer between at least two adjacent pixel regions comprises one opening; and
forming, on the first base subjected to the above step, a light emitting layer and a second electrode of each of the at least one organic light emitting diode, wherein the second electrode of the organic light emitting diode is disconnected at the opening.

17. The manufacturing method of the display panel according to claim 12, wherein the forming the first substrate comprises:
forming, on the first base, a pattern comprising the first electrode of each of the at least one organic light emitting diode by a patterning process;
forming, on the first base subjected to the above step, by a patterning process, a pattern comprising at least one auxiliary electrode in a region defined by at least two adjacent first electrodes;
forming, on the first base subjected to the above step, by a patterning process, a pattern comprising a first pixel definition sub-layer, wherein the first pixel definition sub-layer is formed between the first electrode and the auxiliary electrode adjacent thereto, and surrounds the first electrode, and contacts the auxiliary electrode;
forming, on the first base subjected to the above step, by a patterning process, a pattern comprising a second pixel definition sub-layer, wherein a surface of the second pixel definition sub-layer proximal to the first base completely covers a surface of the first pixel definition sub-layer distal to the first base and partially covers a surface of the auxiliary electrode distal to the first base, and an orthographic projection of the second pixel definition sub-layer on the first base completely covers an orthographic projection of the at least one auxiliary electrode on the first base; and forming, on the first base subjected to the above step, a light emitting layer and a second electrode of each of the at least one organic light emitting diode, wherein the light emitting layer and the second electrode each are disconnected at the opening.

18. The manufacturing method of the display panel according to claim 12, wherein the forming the first substrate comprises:

forming, on the first base, a pattern comprising the first electrode of each of the at least one organic light emitting diode by a patterning process;

forming, on the first base subjected to the above step, by a patterning process, a pattern comprising at least one auxiliary electrode in a region defined by at least two adjacent first electrodes;

forming, on the first base subjected to the above step, by a patterning process, a pattern comprising a pixel definition layer, wherein the pixel definition layer is formed between the first electrode and the auxiliary electrode adjacent thereto, and the pixel definition layer is not in contact with the auxiliary electrode;

forming, on the at least one auxiliary electrode, by a patterning process, a pattern comprising a dam, wherein a surface of the dam proximal to the first base completely covers a surface of the auxiliary electrode distal to the first base, and a cross section of the dam along a direction perpendicular to the first base is an inverted trapezoid; and forming, on the first base subjected to the above step, a light emitting layer and a second electrode of each of the at least one organic light emitting diode, wherein the light emitting layer and the second electrode of the organic light emitting diode each are disconnected at a position of an edge of a surface of the dam distal to the first base.

* * * * *